(12) United States Patent
Buzzetti et al.

(10) Patent No.: US 10,009,021 B1
(45) Date of Patent: Jun. 26, 2018

(54) DISCHARGE CIRCUITS FOR DISCHARGING INDUCTORS WITH TEMPERATURE PROTECTION

(71) Applicant: Maxim Integrated Products, Inc., San Jose, CA (US)

(72) Inventors: Siro Buzzetti, Arese (IT); Marco Demicheli, Binago (IT); Danilo Ranieri, Caronno Pertusella (IT)

(73) Assignee: Maxim Integrated Products, Inc., San Jose, CA (US)

( * ) Notice: Subject to any disclaimer, the term of this patent is extended or adjusted under 35 U.S.C. 154(b) by 0 days. days.

(21) Appl. No.: 15/655,259

(22) Filed: Jul. 20, 2017

(51) Int. Cl.
| | |
|---|---|
| *H01H 47/00* | (2006.01) |
| *H03K 17/0814* | (2006.01) |
| *H03K 17/14* | (2006.01) |
| *H01L 21/8222* | (2006.01) |
| *H03K 17/693* | (2006.01) |
| *H02M 1/42* | (2007.01) |
| *H03K 17/082* | (2006.01) |
| *H01H 47/22* | (2006.01) |

(52) U.S. Cl.
CPC ....... *H03K 17/08146* (2013.01); *H01H 47/22* (2013.01); *H01L 21/8222* (2013.01); *H02M 1/42* (2013.01); *H03K 17/0822* (2013.01); *H03K 17/145* (2013.01); *H03K 17/693* (2013.01)

(58) Field of Classification Search
CPC ........ H01H 47/00; H01H 47/22; H01H 47/26; H01H 47/325; H02H 3/407; H02H 5/04; H02H 5/044; H02H 5/047; H02H 9/047
USPC ................... 361/139, 149; 323/282
See application file for complete search history.

(56) References Cited

U.S. PATENT DOCUMENTS

| | | | | |
|---|---|---|---|---|
| 5,543,996 | A * | 8/1996 | Nakago | H02H 5/044 361/103 |
| 9,673,007 | B2 | 6/2017 | Buzzetti et al. | |
| 2004/0212418 | A1* | 10/2004 | Horn | H03K 17/0822 327/427 |
| 2014/0253083 | A1* | 9/2014 | Shao | H02M 1/32 323/285 |
| 2015/0098163 | A1* | 4/2015 | Ferrara | H02H 5/04 361/113 |
| 2015/0280416 | A1* | 10/2015 | Kreuter | H01H 83/00 361/55 |
| 2015/0280425 | A1* | 10/2015 | Kreuter | H02H 9/02 361/93.1 |

(Continued)

*Primary Examiner* — Tung X Le (57) ABSTRACT

A discharge circuit for demagnetizing an inductive load includes a first switch comprising a control terminal and first and second terminals. The first terminal is connected to a voltage supply. A second switch includes a control terminal and first and second terminals. The second terminal of the first switch and the second terminal of the second switch are connected to the inductive load. A third switch includes a control terminal and first and second terminals. The first terminal of the third switch is connected to the first terminal of the second switch. A first Zener diode includes an anode connected to the control terminal of the second switch and a cathode connected to the voltage supply. A first temperature sensing circuit generates a first sensed temperature signal based on a temperature of at least one component of the circuit. A first comparing circuit receives a first reference temperature signal and the first sensed temperature signal and that generates a first output.

27 Claims, 7 Drawing Sheets

(56) References Cited

U.S. PATENT DOCUMENTS

2016/0013639 A1\* 1/2016 Willkofer ........... H03K 17/0828
                                                                   361/56
2017/0222428 A1\* 8/2017 Choi ...................... H02H 3/085

\* cited by examiner

DISCHARGE CIRCUITS FOR DISCHARGING INDUCTORS WITH TEMPERATURE PROTECTION

CROSS-REFERENCE TO RELATED APPLICATIONS

The present disclosure is related to U.S. Pat. No. 9,673,007 that issued on Jun. 6, 2017 and that is hereby incorporated herein by reference in its entirety.

FIELD

The present disclosure relates to discharge circuits for discharging energy from an inductor.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

One application of an industrial high-side switch is to drive a coil (or inductor) of an electromagnetic relay. During an "ON" phase, the high-side switch delivers current to the coil. The coil generates magnetic force to keep contacts of the electromagnetic relay closed. When the electromagnetic relay is opened, it is desirable to transition the coil current to zero as fast as possible in order to preserve the electromagnetic relay (referred to herein as "fast demagnetization").

Fast demagnetization may be accomplished by making the switch behave as a high-voltage Zener diode, which clamps a voltage of the coil at about $V_{Zener}$=50V below $V_{DD}$. For example with a power supply voltage $V_{DD}$=30V, the inductance of the coil will see a reverse voltage of $V_{DD}-V_{Zener}$=-20V, which will drive the inductance demagnetization.

During fast demagnetization, a discharge circuit generates thermal power ($P=V_{Zener}*I_{inductor}$) that can become very high when large relays are used (e.g. P=50 W). As a consequence, the IC will heat up quickly. Unfortunately, the coil current cannot be stopped while it is flowing. Therefore, the high-side switch needs to rely solely upon the power dissipation capability of the IC package to maintain the temperature of the IC until the coil is completely discharged. Above a certain energy level (depending on the size of the electromagnetic relay and on the initial current), the high-side switch eventually fails and is permanently damaged.

SUMMARY

A discharge circuit for demagnetizing an inductive load includes a first switch comprising a control terminal and first and second terminals. The first terminal is connected to a voltage supply. A second switch includes a control terminal and first and second terminals. The second terminal of the first switch and the second terminal of the second switch are connected to the inductive load. A third switch includes a control terminal and first and second terminals. The first terminal of the third switch is connected to the first terminal of the second switch. A first Zener diode includes an anode connected to the control terminal of the second switch and a cathode connected to the voltage supply. A first temperature sensing circuit generates a first sensed temperature signal based on a temperature of at least one component of the circuit. A first comparing circuit receives a first reference temperature signal and the first sensed temperature signal and that generates a first output.

In other features, the first switch comprises a double-diffused metal oxide semiconductor (DMOS) field effect switch (FET). The second switch and the third switch comprise DMOS FETs. The circuit is implemented as a single integrated circuit and each of the first switch, the second switch and the third switch comprises a transistor. The second switch and the third switch are turned on based on the first output of the first comparing circuit when the first sensed temperature signal is greater than the first reference temperature signal. The second switch and the third switch are turned off based on the first output of the first comparing circuit when the first sensed temperature signal is less than the first reference temperature signal.

In other features, the second switch and the third switch are turned on based on the first output of the first comparing circuit when the first sensed temperature signal is greater than the first reference temperature signal by a first predetermined amount. The second switch and the third switch are turned off when the first sensed temperature signal is less than the first reference temperature signal by a second predetermined amount.

In other features, when the first switch is turned off, power from the inductive load is dissipated by the discharge circuit at a first rate until the first sensed temperature signal is less than the first reference temperature signal. The discharge circuit dissipates power at a second rate that is slower than the first rate when the first sensed temperature signal is greater than the first reference temperature signal.

In other features, the discharge circuit dissipates power at the second rate until the sensed temperature signal falls below the reference temperature signal by a first predetermined amount. The discharge circuit dissipates power at the first rate after the sensed temperature signal falls below the reference temperature signal by a second predetermined amount.

In other features, each of the first switch, the second switch and the third switch includes a transistor with a body to epitaxial diode. The inductive load includes an inductor. The first temperature sensing circuit senses a temperature of the second switch.

A second Zener diode includes an anode connected to the control terminal of the first switch and a cathode connected to the voltage supply. A second temperature sensing circuit generates a second sensed temperature signal based on a temperature of the first switch. A second comparing circuit receives a second reference temperature signal and the second sensed temperature signal and that generates a second output.

In other features, a driver circuit receives the first output and the second output and control states of the first switch, the second switch and the third switch based on the first output and the second output. The driver circuit comprises at least one of a logic circuit and a lookup table.

In other features, the driver circuit causes the discharge circuit to dissipate power at a first rate while the first and second sensed temperature signals are below the first and second reference temperature signals, respectively, by a first predetermined amount. The driver circuit causes the discharge circuit to dissipate power at a second rate less than the first rate when the first and second sensed temperature signals are above the first and second reference temperature signals, respectively, by a second predetermined amount.

In other features, the driver circuit causes the discharge circuit to dissipate power at a first rate while the first and second sensed temperature signals are below the first and second reference temperature signals, respectively. The driver circuit causes the discharge circuit to dissipate power at a second rate less than the first rate when the first and second sensed temperature signals are above the first and second reference temperature signals, respectively.

In other features, the driver circuit causes the first switch to operate as part of a clamp when the second temperature signal is less than the second reference temperature signal. The driver circuit causes the second switch to operate as part of a clamp when the second temperature signal is greater than the second reference temperature signal and the first temperature signal is less than the first reference temperature signal.

A discharge circuit for demagnetizing an inductive load includes a first switch comprising a control terminal and first and second terminals. The first terminal of the first switch is connected to a voltage supply. A second switch includes a control terminal and first and second terminals, wherein the first terminal of the second switch is connected to the second terminal of the first switch. A third switch includes a control terminal and first and second terminals. The first terminal of the third switch is connected to the second terminal of the first switch and the first terminal of the second switch. The second terminal of the third switch is connected to an output node. A Zener diode includes an anode connected to the control terminal of the third switch and a cathode connected to the first terminal of the third switch and the first terminal of the second switch. A temperature sensing circuit generates a sensed temperature signal based on a temperature of at least one component of the circuit. A comparing circuit receives a reference temperature signal and the sensed temperature signal and an output. The control terminals of the second switch and the third switch are controlled based on the output of the comparing circuit.

In other features, the first switch comprises a double-diffused metal oxide semiconductor (DMOS) field effect switch (FET). The second switch and the third switch comprise DMOS FETs. The circuit is implemented as a single integrated circuit and each of the first switch, the second switch and the third switch comprises a transistor.

In other features, the second switch and the third switch are turned on based on the output of the comparing circuit when the sensed temperature signal is greater than the reference temperature signal. The second switch and the third switch are turned off based on the output of the comparing circuit when the sensed temperature signal is less than the reference temperature signal.

In other features, the second switch and the third switch are turned on based on the output of the comparing circuit when the sensed temperature signal is greater than the reference temperature signal by a first predetermined amount. The second switch and the third switch are turned off based on the output of the comparing circuit when the sensed temperature signal is less than the reference temperature signal by a second predetermined amount.

In other features, when the first switch is turned off, power from the inductive load is dissipated by the circuit at a first rate until the sensed temperature signal is equal to the reference temperature signal. The circuit dissipates power at a second rate that is slower than the first rate when the sensed temperature signal is greater than the reference temperature signal.

In other features, the circuit dissipates power at the second rate until the sensed temperature signal falls below the reference temperature signal by a first predetermined amount. The circuit dissipates power at the first rate after the sensed temperature signal falls below the reference temperature signal by a second predetermined amount.

In other features, each of the first switch, the second switch and the third switch includes a transistor with a body to epitaxial diode. The inductive load includes an inductor. The temperature sensing circuit senses a temperature of the third switch.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

The present disclosure relates to discharge circuits for safely demagnetizing an inductor or coil. The discharge circuit is implemented using an integrated circuit (IC), discrete components or a combination thereof. The discharge circuit protects the IC and/or discrete components from overheating during demagnetization of the inductor. The demagnetization can be performed without damage independent of an amount of energy that needs to be dissipated. The systems and methods according to the present disclosure allow the use of relays of any size and allow the IC to be mounted in smaller IC packages.

As will be described further below, the discharge circuit monitors temperature and performs in a typical manner until a predetermined temperature is exceeded. When the predetermined temperature is exceeded, the circuit provides protection at the expense of a temporarily reduced discharge rate. The performance reduction will have a negligible negative impact for most applications.

Controlled demagnetization is accomplished by automatically selecting a fast or slow demagnetization mode. During the fast demagnetization mode, the discharge circuit behaves in a typical fashion. For example, the discharge circuit may clamp the coil or inductor voltage to about 50V below $V_{DD}$. During the fast demagnetization mode, the temperature of components in the discharge circuit will rise at a fast pace. Once the predetermined temperature is reached, the discharge circuit switches to the slow demagnetization mode and will reduce power dissipation to a level that can be sustained indefinitely. During the slow demagnetization mode, the coil or inductor discharges at a slower rate and the IC temperature will decrease. Once the temperature has fallen back to an acceptable temperature value, the fast demagnetization mode is initiated again. The discharge circuit switches between the fast and slow demagnetization modes until the coil or inductor is completely discharged.

Figure 1A:
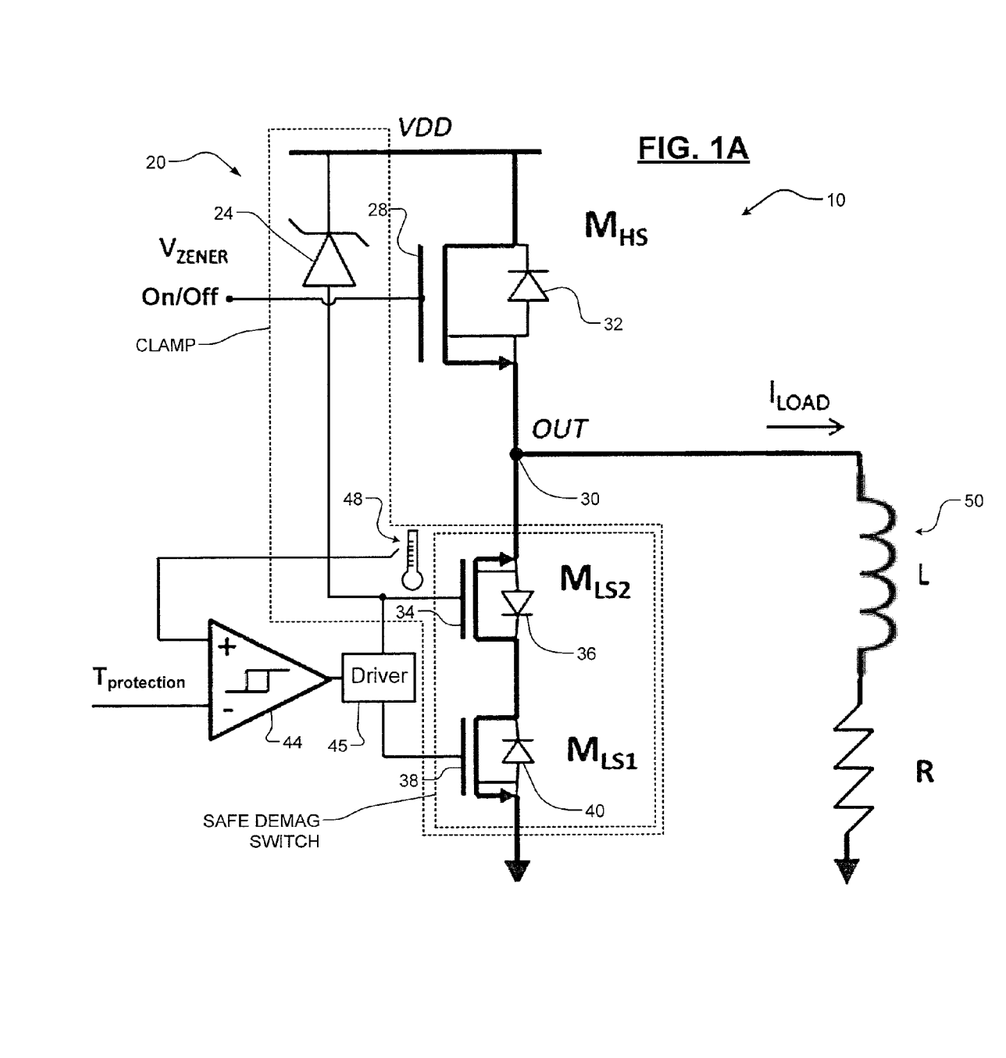
FIG. 1A is an electrical schematic and functional block diagram of an example of a discharge circuit for an inductor according to the present disclosure.

Referring now to FIG. 1A, a circuit 10 (such as an integrated circuit (IC), discrete components or combinations thereof) includes a discharge circuit 20. The discharge circuit 20 includes a transistor 28 acting as a high-side switch $M_{HS}$. The transistor 28 has a first terminal connected to $V_{DD}$, a second terminal connected to an output node 30, and a control terminal. In some examples, the transistor 28 includes a body to epitaxial (EPI) diode 32.

A safe demagnetization switch includes a first transistor 34 and a second transistor 38 acting as a low side switches $M_{LS2}$ and $M_{LS1}$, respectively. The transistor 34 includes a second terminal connected to the output node 30. In some examples, the transistor 34 includes a body to epitaxial (EPI) diode 36. A first terminal of the transistor 34 is connected to a first terminal of the transistor 38. A second terminal of the transistor 38 is connected to a reference potential such as ground. In some examples, the transistor 38 includes a body to epitaxial (EPI) diode 40.

Control terminals of the first and second transistors 34 and 38 are connected to a driver circuit 45. The driver circuit 45 is connected to an output of a comparing circuit 44. The driver circuit 45 controls the control terminals of the first and second transistors 34 and 38 based on a state of the comparing circuit 44. An anode of a Zener diode 24 is connected to the control terminal of the transistor 34. A cathode of the Zener diode 24 is connected to $V_{DD}$. In some examples, the comparing circuit 44 employs hysteresis. An inverting input of the comparing circuit 44 is connected to a first temperature reference signal $T_{protection}$. A non-inverting input of the comparing circuit 44 is connected to a temperature sensor 48 that generates a sensed temperature signal based on a temperature of $M_{LS2}$. A load 50 is connected to the output of the discharge circuit 20. The load 50 may include an inductor L and a resistor R that are connected in series, although other types of loads or connections may be used.

In this example, the transistor 28 acts as a load driver to charge the load 50. The clamp circuit includes the transistors 34 and 38, the Zener diode 24 and the temperature sensor 48. The safe demagnetization switch includes the transistors 34 and 38.

Figure 1B:
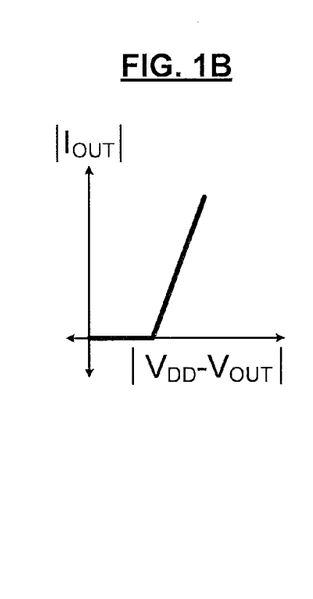
FIG. 1B illustrates current of the clamp circuit as a function of $|V_{DD}-V_{OUT}|$.

In FIG. 1B, the clamp current/voltage characteristics are shown as a function of $|V_{DD}-V_{OUT}|$. The clamp circuit starts providing current $|I_{OUT}|$ when the difference $|V_{DD}-V_{OUT}|$ increases above the clamp voltage. In some examples, the clamp voltage is equal to 50V, although other values can be used.

The clamp and the switch are made by the same transistors. What distinguishes the two functions is the voltage drop across the second low side switch $M_{LS2}$. During the clamp phase, the voltage drops mainly across the second low side switch $M_{LS2}$, thus the power is dissipated mainly by the second low side switch $M_{LS2}$. With the same $V_{DD}$=30V, $V_{CLAMP}$=50V and $V_{OUT}$=-20V, the discharge circuit dissipates 20V times the current (i.e. 20 W with 1 A current). Therefore this configuration is more energy efficient than the circuit shown in U.S. Pat. No. 9,673,007. However, the second low side switch $M_{LS2}$ needs to be larger to dissipate the relatively large power. The high side switch $M_{HS}$ is still the load driver (i.e. the initial current $I_{LOAD}$ is provided by turning on the high side switch $M_{HS}$).

Figure 2A:
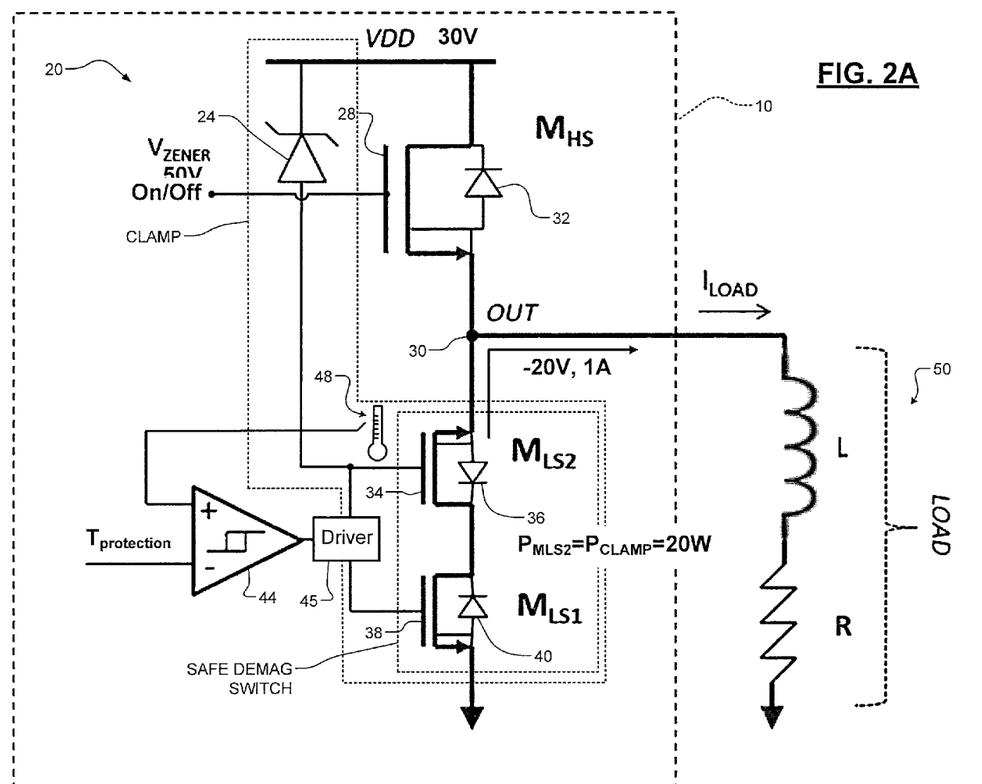
FIG. 2A is an electrical schematic and functional block diagram of an example of the discharge circuit of FIG. 1A during a fast demagnetization mode according to the present disclosure.
Figure 2B:
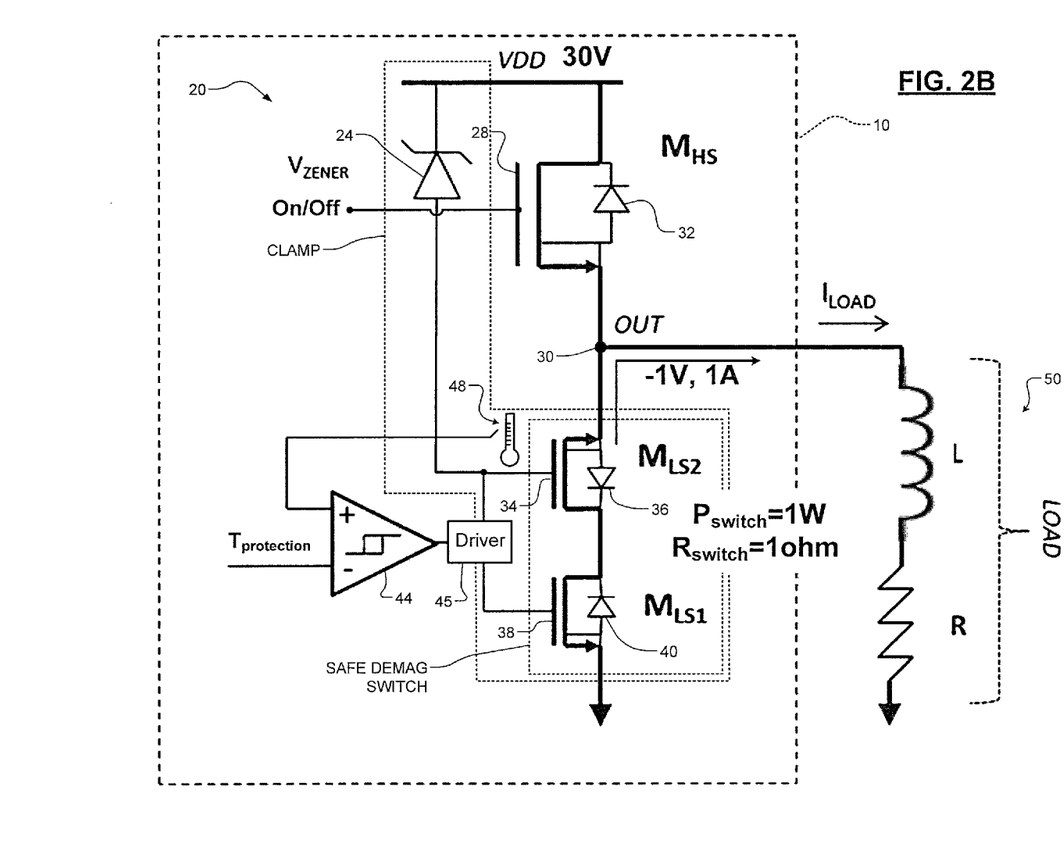
FIG. 2B is an electrical schematic and functional block diagram of an example of the discharge circuit of FIG. 1A during a slow demagnetization mode according to the present disclosure.

Referring now to FIGS. 2A and 2B, an example illustrating operation of the discharge circuit 20 of FIG. 1A is shown. The foregoing discussion assumes that the load was previously charged with load current $I_{LOAD}$ of 1 A. During fast demagnetization (FIG. 2A), the inductor current pulls OUT negative. The high side switch $M_{HS}$ is kept in the off state. The control terminal of the second low side switch $M_{LS2}$ follows OUT and therefore the voltage across the Zener diode increases. When $V_{ZENER}$=50V, the control terminal of the second low side switch $M_{LS2}$ stops decreasing and therefore the gate-source voltage of the second low side switch $M_{LS2}$ increases and the second low side switch $M_{LS2}$ turns on. The load current flows through the second low side switch $M_{LS2}$ and the diode of the first low side switch $M_{LS1}$. The second low side switch $M_{LS2}$ dissipates power=$V_{CLAMP}*I_{LOAD}$, which makes the temperature of the second low side switch $M_{LS2}$ increase. Once the temperature of the second low side switch $M_{LS2}$ reaches $T_{PROTECTION}$, safe demagnetization is performed.

During safe demagnetization (FIG. 2B), the first low side switch $M_{LS1}$ and the second low side switch $M_{LS2}$ are turned fully on. The load current still flows through the first low side switch $M_{LS1}$ and the second low side switch $M_{LS2}$, which are sized so that their total voltage drop is ~1V (i.e. $V_{OUT}$~-1V). The second low side switch $M_{LS2}$ now dissipates much less power and cools down. When the temperature of the second low side switch $M_{LS2}$ falls below $T_{PROTECTION}$ by a hysteresis amount, the discharge circuit returns to fast demagnetization.

As compared to prior discharge circuits such as the discharge circuit in commonly-assigned U.S. Pat. No. 9,673,007, the discharge circuit 20 in FIG. 1 dissipates less power during the fast demagnetization mode. As a result, the discharge circuit 20 will also tend to overheat less often due to the lower power being absorbed by the clamp circuit.

In some examples, the transistor 28 includes a low-on-resistance, high-voltage transistor such as a $R_{ON}$=0.050, 65V double-diffused metal-oxide-semiconductor (DMOS) field effect transistors (FET). In some examples, the maximum current $I_{LOAD}$ that has to be sourced is 1 A. In some examples, the transistors 34 and 38 may be implemented using DMOS FETs with smaller area than the transistor 28 (and therefore higher on-resistance). In some examples, $R_{ON}$ of the transistors 34 and 38 is 0.5Ω. In some examples, the transistors 34 and 38 are normally kept in an off state ($V_{GS}$=0V) and do not conduct current for either positive or negative values of $V_{OUT}$ due to opposite body-to-EPI diodes 36 and 40. The transistors 34, 38 can be p-channel transistor or n-channel transistors. In some examples, the transistors 34, 38 are n-channel transistors with directly connected drains. In some examples, the transistors include double-diffused metal oxide semiconductor (DMOS) field effect transistors (FETs). In some examples, the control terminal corresponds to a gate of a transistor, the first terminal corresponds to a source of a transistor and the second terminal corresponds to a drain of a transistor.

Figure 3:
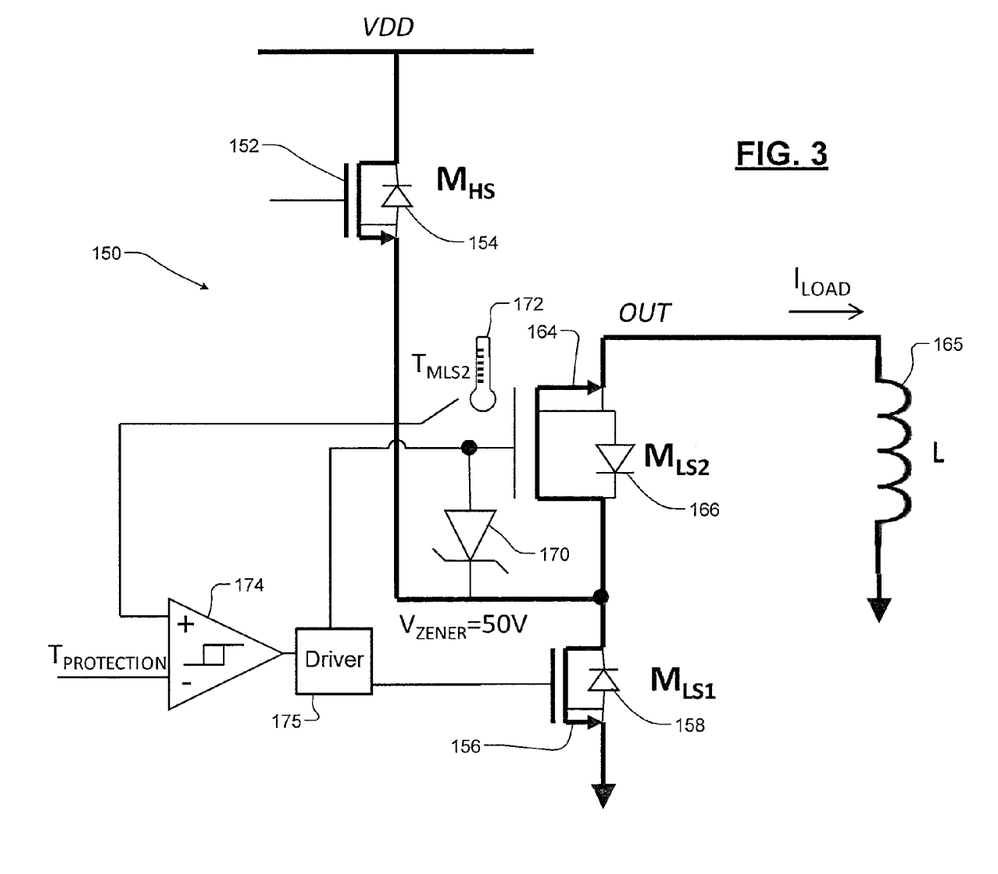
FIG. 3 is an electrical schematic and functional block diagram of another example of a discharge circuit for an inductor according to the present disclosure.

Referring now to FIG. 3, a discharge circuit 150 for an inductor is shown. The discharge circuit 150 includes a high side switch $M_{HS}$ including a first terminal, a second terminal and a control terminal. For example, the high side switch $M_{HS}$ includes a transistor 152 including a body to epitaxial (EPI) diode 154. The discharge circuit 150 includes a first low side switch $M_{LS1}$ including a first terminal, a second terminal and a control terminal. For example, the first low side switch $M_{LS1}$ includes a transistor 156 including a body to epitaxial (EPI) diode 158. The discharge circuit 150 includes a second low side switch $M_{LS2}$ including a first terminal, a second terminal and a control terminal. For example, the second low side switch $M_{LS2}$ includes a transistor 164 including a body to epitaxial (EPI) diode 166.

The first terminal of the high side switch $M_{HS}$ is connected to a voltage supply $V_{DD}$. The second terminal of the high side switch $M_{HS}$ is connected to the first terminal of the first low side switch $M_{LS1}$ and the first terminal of the second low side switch $M_{LS2}$. A second terminal of the second low side switch $M_{LS2}$ is connected to a load 165. A Zener diode 170 includes an anode connected to the control terminal of the second low side switch $M_{LS1}$ and a cathode connected to the first terminal of the first low side switch $M_{LS1}$ and the first terminal of the second low side switch $M_{LS2}$.

A temperature sensor 172 senses a temperature of the second low side switch $M_{LS2}$. A comparing circuit 174 receives a reference temperature signal $T_{protection}$ and a sensed temperature signal from the temperature sensor 172. In some examples, the comparing circuit 174 uses hysteresis. An output of the comparing circuit 174 is input to a driver circuit 175. The driver circuit 175 controls the control terminals of the first low side switch $M_{LS1}$ and the second low side switch $M_{LS2}$.

During fast demagnetization, a clamp is formed by the first low side switch $M_{LS1}$, the second low side switch $M_{LS2}$, the Zener diode 170, and the temperature sensor 172. During safe demagnetization, the safe demagnetization switch is implemented by the first low side switch $M_{LS1}$ and the second low side switch $M_{LS2}$.

Figure 4A:
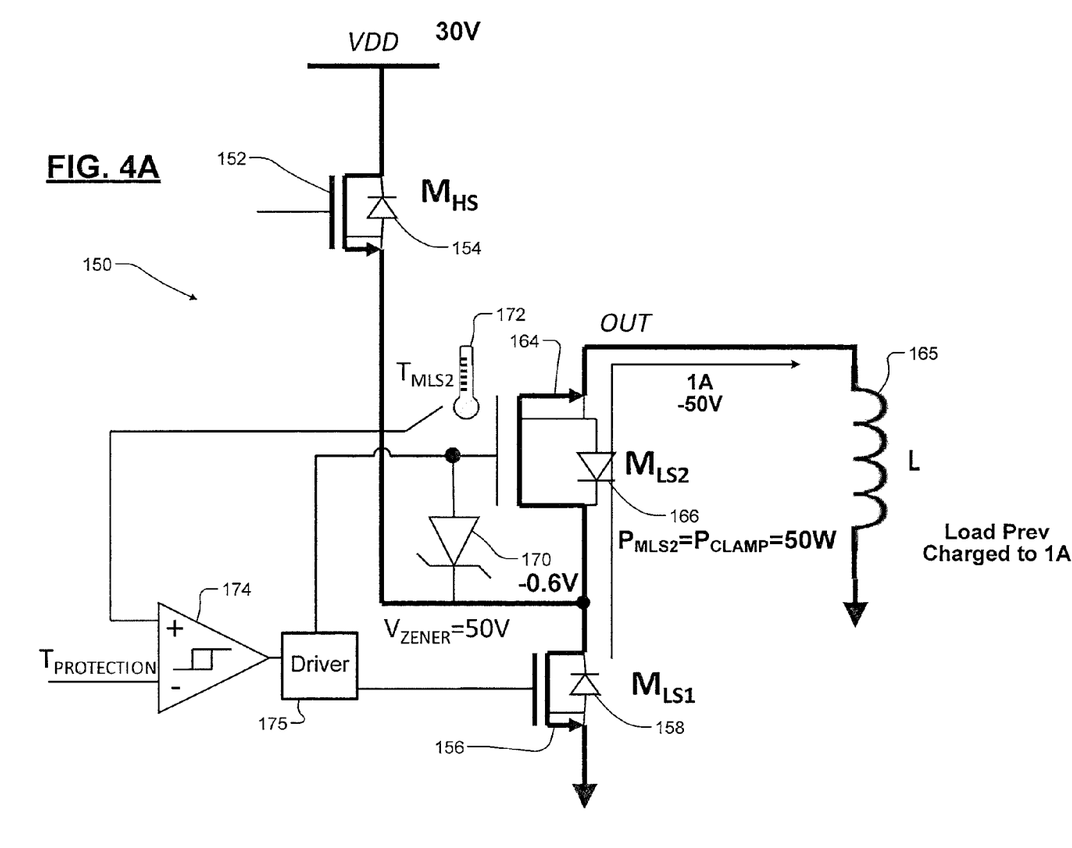
FIG. 4A is an electrical schematic and functional block diagram of an example of the discharge circuit of FIG. 3 during a fast demagnetization mode according to the present disclosure.

Referring now to FIG. 4A, during fast demagnetization, inductor current of the load 165 pulls OUT negative and the high side switch $M_{HS}$ is kept in the off state. The cathode of the Zener diode 170 goes to about –0.6V (due to the diode of the first low side switch $M_{LS1}$). The control terminal of the second low side switch $M_{LS2}$ follows OUT and therefore the voltage across the Zener diode 170 increases. When $V_{ZENER}$=50V, the control terminal of the second low side switch $M_{LS2}$ stops decreasing and therefore the gate-source voltage of the second low side switch $M_{LS2}$ increases and the second low side switch $M_{LS2}$ turns on. The load current flows through the second low side switch $M_{LS2}$ and the diode of the first low side switch $M_{LS1}$. The second low side switch $M_{LS2}$ dissipates power=$V_{ZENER}$*$I_{LOAD}$, which makes the temperature of the second low side switch $M_{LS2}$ increase. Once the second low side switch $M_{LS2}$ reaches $T_{PROTECTION}$, operation transitions to the safe demagnetization mode.

Figure 4B:
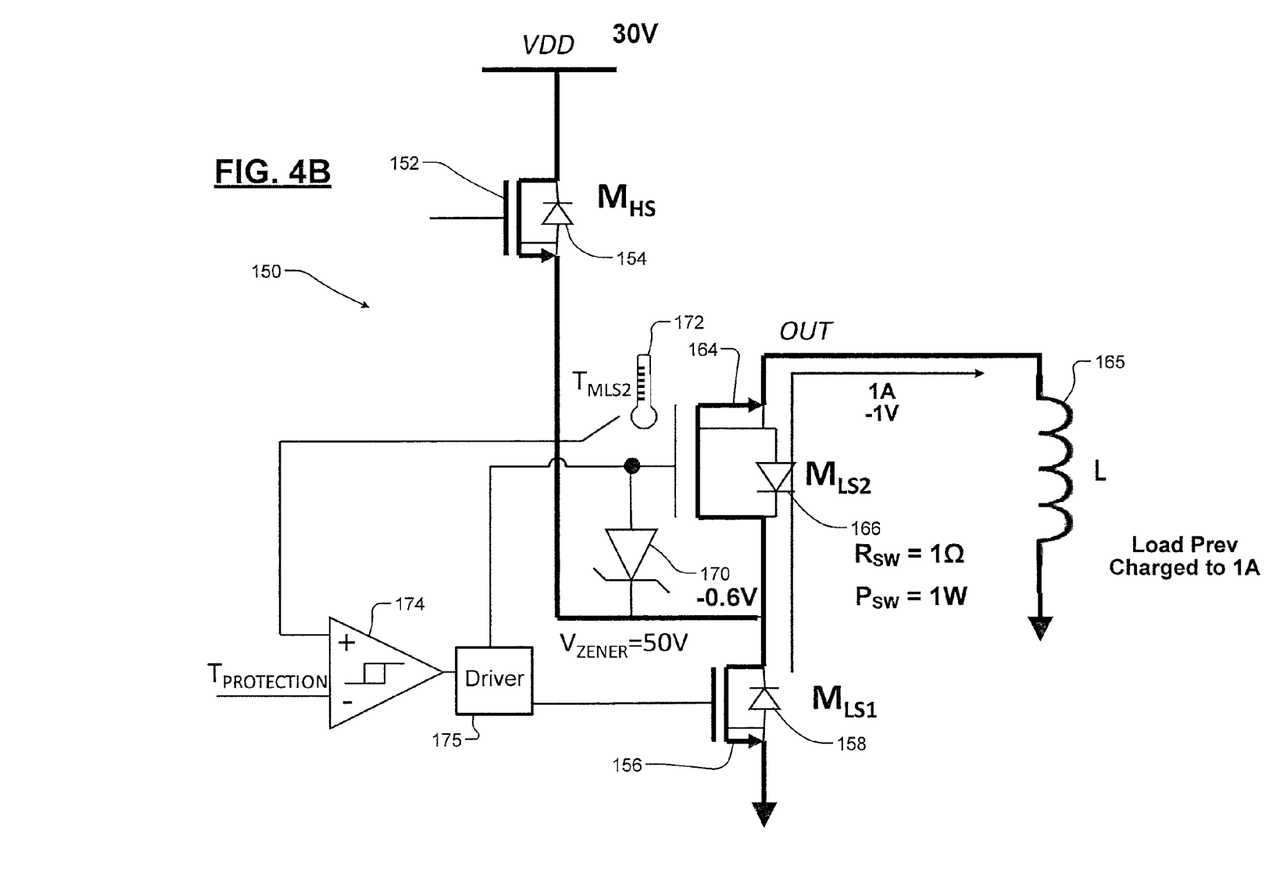
FIG. 4B is an electrical schematic and functional block diagram of an example of the discharge circuit of FIG. 3 during a slow demagnetization mode according to the present disclosure.

Referring now to FIG. 4B, during the safe demagnetization mode, the first low side switch $M_{LS1}$ and the second low side switch $M_{LS2}$ are turned fully on. The load current still flows through the first low side switch $M_{LS1}$ and the second low side switch $M_{LS2}$, which are sized so that their total voltage drop is ~1V (i.e. $V_{OUT}$=–1V). The second low side switch $M_{LS2}$ now dissipates less power and cools down. When the temperature of $M_{LS2}$ goes below $T_{PROTECTION}$ by a hysteresis amount, the discharge circuit returns to fast demagnetization mode.

In FIGS. 3-4B, the clamp and the switch are made by the same transistors and the power is still dissipated mainly by the second low side switch $M_{LS2}$. Compared to the previous approach, this solution reaches a higher discharge voltage with the same $V_{DD}$=30V, $V_{CLAMP}$=50V, $V_{OUT}$=–49V (a voltage drop of 1V is assumed on the first low side switch $M_{LS1}$).

One advantage of this design is that high power is dissipated at a faster discharge rate (because $V_{OUT}$ goes more negative). A second advantage is that the high side switch $M_{HS}$ needs to withstand a lower voltage and therefore it can be made smaller. Here, the load driver is made by the high side switch $M_{HS}$ and the second low side switch $M_{LS2}$ working in series.

Figures 5A, 5B:
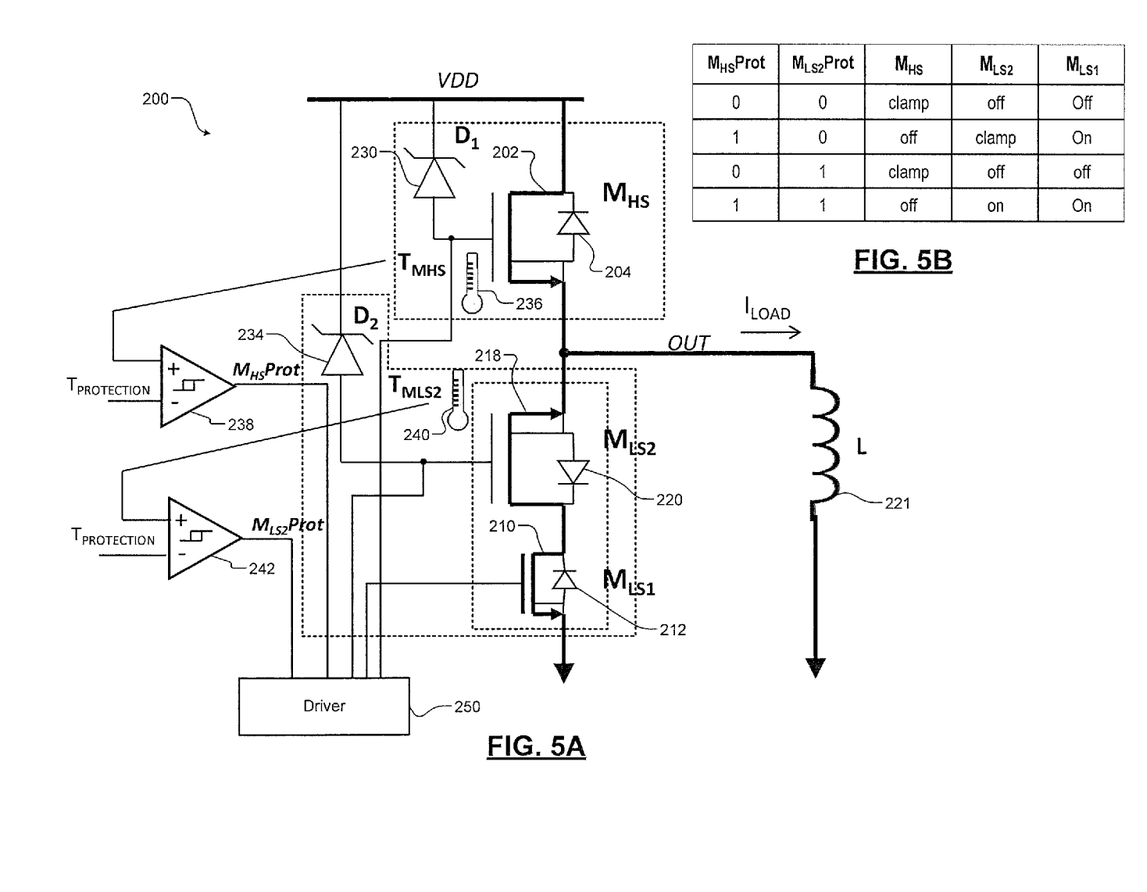
FIG. 5A is an electrical schematic and functional block diagram of another example of a discharge circuit for an inductor according to the present disclosure.
FIG. 5B is a truth table illustrating operation of the discharge circuit of FIG. 5A.

Referring now to FIGS. 5A-5B, a discharge circuit 200 for an inductor is shown. The discharge circuit 200 includes a high side switch $M_{HS}$ including a first terminal, a second terminal and a control terminal. For example, the high side switch $M_{HS}$ includes a transistor 202 including a body to epitaxial (EPI) diode 204. The discharge circuit 200 includes a first low side switch $M_{LS1}$ including a first terminal, a second terminal and a control terminal. For example, the first low side switch $M_{LS1}$ includes a transistor 210 including a body to epitaxial (EPI) diode 212. The discharge circuit 200 includes a second low side switch $M_{LS2}$ including a first terminal, a second terminal and a control terminal. For example, the second low side switch $M_{LS2}$ includes a transistor 218 including a body to epitaxial (EPI) diode 220.

The first terminal of the high side switch $M_{HS}$ is connected to a voltage supply $V_{DD}$. The second terminal of the high side switch $M_{HS}$ is connected to the second terminal of the second low side switch $M_{LS2}$ and to a load 221. A first terminal of the first low side switch $M_{LS1}$ is connected the first terminal of the second low side switch $M_{LS2}$. A Zener diode 230 includes an anode connected to the control terminal of the high side switch $M_{HS}$ and a cathode connected to the voltage supply $V_{DD}$. A Zener diode 234 includes an anode connected to the control terminal of the second low side switch $M_{LS2}$ and a cathode connected to the voltage supply $V_{DD}$.

A temperature sensor 236 generates a sensed temperature signal based on a temperature of the high side switch $M_{HS}$. A temperature sensor 240 generates a sensed temperature signal based on a temperature of the second low side switch $M_{LS2}$. A comparing circuit 238 receives a reference temperature signal $T_{protection}$ and the sensed temperature signal from the temperature sensor 236. A comparing circuit 242 receives a reference temperature signal $T_{protection}$ and the sensed temperature signal from the temperature sensor 240. In some examples, the comparing circuits 238, 242 use hysteresis. Outputs of the comparing circuits 238, 242 are input to a driver circuit 250 having outputs connected to the control terminals of the high side switch $M_{HS}$ and the first and second low side switches $M_{LS1}$ and $M_{LS2}$. An example of a truth table specifying operation of the logic circuit of lookup table 250 is shown in FIG. 5B. In some examples, the driver circuit 250 includes a logic circuit or lookup table (LUT).

In this example, two clamps are used. The first clamp is the high side switch $M_{HS}$. The second clamp is the second low side switch $M_{LS2}$ as in FIGS. 1A and 1B. This arrangement allows additional use of FAST demagnetization function (i.e. the CLAMP function) as will be described below.

During fast demagnetization, either the high side switch $M_{HS}$ or the second low side switch $M_{LS2}$ are used as clamp, depending on corresponding temperatures thereof (see FIG. 5B). If the temperature of the high side switch $M_{HS}$ is less than $T_{PROTECTION}$, then the high side switch $M_{HS}$ works as a clamp (the high side switch $M_{HS}$ tends to get hot).

If the temperature of the high side switch $M_{HS}$ is greater than $T_{PROTECTION}$ and the temperature of the second low side switch $M_{LS2}$ is less than $T_{PROTECTION}$, then the second low side switch $M_{LS2}$ works as a clamp (the high side switch $M_{HS}$ tends to cool down while the second low side switch $M_{LS2}$ tends to get hot). If the temperature of the high side switch $M_{HS}$ and the second low side switch $M_{LS2}$ are greater than $T_{PROTECTION}$, the discharge circuit performs safe demagnetization.

During safe demagnetization, the first low side switch $M_{LS1}$ and the second low side switch $M_{LS2}$ are turned fully on thus making $V_{OUT}$~−1V. The first low side switch $M_{LS1}$ and the second low side switch $M_{LS2}$ dissipate little power, the high side switch $M_{HS}$ dissipates no power and the whole system tends to cool down. At some point either the high side switch $M_{HS}$ or the second low side switch $M_{LS2}$ will fall below $T_{PROTECTION}$ and will start again working as a clamp (fast demagnetization).

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

What is claimed is:

1. A discharge circuit for demagnetizing an inductive load, comprising:
   a first switch comprising a control terminal and first and second terminals, wherein the first terminal is connected to a voltage supply;
   a second switch comprising a control terminal and first and second terminals, wherein the second terminal of the first switch and the second terminal of the second switch are connected to the inductive load;
   a third switch comprising a control terminal and first and second terminals, wherein the first terminal of the third switch is connected to the first terminal of the second switch;
   a first Zener diode including an anode connected to the control terminal of the second switch and a cathode connected to the voltage supply;
   a first temperature sensing circuit that generates a first sensed temperature signal based on a temperature of at least one component of the circuit; and
   a first comparing circuit that receives a first reference temperature signal and the first sensed temperature signal and that generates a first output.

2. The discharge circuit of claim 1, wherein:
   the first switch comprises a double-diffused metal oxide semiconductor (DMOS) field effect switch (FET); and the second switch and the third switch comprise DMOS FETs.

3. The discharge circuit of claim 1, wherein the circuit is implemented as a single integrated circuit and each of the first switch, the second switch and the third switch comprises a transistor.

4. The discharge circuit of claim 1, wherein the second switch and the third switch are turned based on the first output of the first comparing circuit when the first sensed temperature signal is greater than the first reference temperature signal and the second switch and the third switch are turned off based on the first output of the first comparing circuit when the first sensed temperature signal is less than the first reference temperature signal.

5. The discharge circuit of claim 1, wherein the second switch and the third switch are turned based on the first output of the first comparing circuit when the first sensed temperature signal is greater than the first reference temperature signal by a first predetermined amount, and the second switch and the third switch are turned off based on the first output of the first comparing circuit when the first sensed temperature signal is less than the first reference temperature signal by a second predetermined amount.

6. The discharge circuit of claim 1, wherein:
   when the first switch is turned off, power from the inductive load is dissipated by the discharge circuit at a first rate until the first sensed temperature signal is less than the first reference temperature signal, and
   the discharge circuit dissipates power at a second rate that is slower than the first rate when the first sensed temperature signal is greater than the first reference temperature signal.

7. The discharge circuit of claim 6, wherein:
   the discharge circuit dissipates power at the second rate until the first sensed temperature signal falls below the first reference temperature signal by a first predetermined amount; and
   the discharge circuit dissipates power at the first rate after the first sensed temperature signal falls below the first reference temperature signal by a second predetermined amount.

8. The circuit of claim 1, wherein each of the first switch, the second switch and the third switch includes a transistor with a body to epitaxial diode.

9. The discharge circuit of claim 1, wherein the inductive load includes an inductor.

10. The discharge circuit of claim 1, wherein the first temperature sensing circuit senses the temperature of the second switch.

11. The discharge circuit of claim 10, further comprising:
    a second Zener diode including an anode connected to the control terminal of the first switch and a cathode connected to the voltage supply; and
    a second temperature sensing circuit to generate a second sensed temperature signal based on a temperature of the first switch.

12. The discharge circuit of claim 11, further comprising a second comparing circuit that receives a second reference temperature signal and the second sensed temperature signal and that generates a second output.

13. The discharge circuit of claim 12, further comprising a driver circuit to receive the first output and the second output and to control states of the first switch, the second switch and the third switch based on the first output and the second output.

14. The discharge circuit of claim 13, wherein the driver circuit comprises at least one of a logic circuit and a lookup table.

15. The discharge circuit of claim 13, wherein:
the driver circuit causes the discharge circuit to dissipate power at a first rate while the first and second sensed temperature signals are below the first and second reference temperature signals, respectively, by a first predetermined amount; and
the driver circuit causes the discharge circuit to dissipate power at a second rate less than the first rate when the first and second sensed temperature signals are above the first and second reference temperature signals, respectively, by a second predetermined amount.

16. The discharge circuit of claim 13, wherein:
the driver circuit causes the discharge circuit to dissipate power at a first rate while the first and second sensed temperature signals are below the first and second reference temperature signals, respectively; and
the driver circuit causes the discharge circuit to dissipate power at a second rate less than the first rate when the first and second sensed temperature signals are above the first and second reference temperature signals, respectively.

17. The discharge circuit of claim 13, wherein:
the driver circuit causes the first switch to operate as part of a clamp when the second sensed temperature signal is less than the second reference temperature signal; and
the driver circuit causes the second switch to operate as part of a clamp when the second sensed temperature signal is greater than the second reference temperature signal and the first temperature signal is less than the first reference temperature signal.

18. A discharge circuit for demagnetizing an inductive load, comprising:
a first switch comprising a control terminal and first and second terminals, wherein the first terminal of the first switch is connected to a voltage supply;
a second switch comprising a control terminal and first and second terminals, wherein the first terminal of the second switch is connected to the second terminal of the first switch;
a third switch comprising a control terminal and first and second terminals, wherein the first terminal of the third switch is connected to the second terminal of the first switch and the first terminal of the second switch, and wherein the second terminal of the third switch is connected to an output node;
a Zener diode including an anode connected to the control terminal of the third switch and a cathode connected to the first terminal of the third switch and the first terminal of the second switch;
a temperature sensing circuit that generates a sensed temperature signal based on a temperature of at least one component of the circuit; and
a comparing circuit that receives a reference temperature signal and the sensed temperature signal and that generates an output.

19. The discharge circuit of claim 18, wherein:
the first switch comprises a double-diffused metal oxide semiconductor (DMOS) field effect switch (FET); and
the second switch and the third switch comprise DMOS FETs.

20. The discharge circuit of claim 18, wherein the circuit is implemented as a single integrated circuit and each of the first switch, the second switch and the third switch comprises a transistor.

21. The discharge circuit of claim 18, wherein the second switch and the third switch are turned on based on the output of the comparing circuit when the sensed temperature signal is greater than the reference temperature signal and the second switch and the third switch are turned off based on the output of the comparing circuit when the sensed temperature signal is less than the reference temperature signal.

22. The discharge circuit of claim 18, wherein the second switch and the third switch are turned on based on the output of the comparing circuit when the sensed temperature signal is greater than the reference temperature signal by a first predetermined amount and the second switch and the third switch are turned off based on the output of the comparing circuit when the sensed temperature signal is less than the reference temperature signal by a second predetermined amount.

23. The discharge circuit of claim 18, wherein:
when the first switch is turned off, power from the inductive load is dissipated by the circuit at a first rate until the sensed temperature signal is equal to the reference temperature signal, and
the circuit dissipates power at a second rate that is slower than the first rate when the sensed temperature signal is greater than the reference temperature signal.

24. The discharge circuit of claim 23, wherein:
the circuit dissipates power at the second rate until the sensed temperature signal falls below the reference temperature signal by a first predetermined amount; and
the circuit dissipates power at the first rate after the sensed temperature signal falls below the reference temperature signal by a second predetermined amount.

25. The discharge circuit of claim 18, wherein each of the first switch, the second switch and the third switch includes a transistor with a body to epitaxial diode.

26. The discharge circuit of claim 18, wherein the inductive load includes an inductor.

27. The discharge circuit of claim 18, wherein the temperature sensing circuit senses the temperature of the third switch.

* * * * *

UNITED STATES PATENT AND TRADEMARK OFFICE
CERTIFICATE OF CORRECTION

PATENT NO. : 10,009,021 B1
APPLICATION NO. : 15/655259
DATED : June 26, 2018
INVENTOR(S) : Buzzetti et al.

Page 1 of 1

It is certified that error appears in the above-identified patent and that said Letters Patent is hereby corrected as shown below:

On the Title Page

Column 1, (*) Notice, Line 3      Delete "days. days." and insert -- days. --
Showing the illustrated figure      Delete "VDD" and insert -- $V_{DD}$ --

In the Drawings

Sheet 1 of 7, Fig. 1A      Delete "VDD" and insert -- $V_{DD}$ --
Sheet 2 of 7, Fig. 2A      Delete "VDD" and insert -- $V_{DD}$ --
Sheet 3 of 7, Fig. 2B      Delete "VDD" and insert -- $V_{DD}$ --
Sheet 4 of 7, Fig. 3      Delete "VDD" and insert -- $V_{DD}$ --
Sheet 5 of 7, Fig. 4A      Delete "VDD" and insert -- $V_{DD}$ --
Sheet 6 of 7, Fig. 4B      Delete "VDD" and insert -- $V_{DD}$ --
Sheet 7 of 7, Fig. 5A      Delete "VDD" and insert -- $V_{DD}$ --

In the Specification

Column 6, Line 42      Delete "$V_{OUT}$~-1V)." and insert -- $V_{OUT}$=-1V). --
Column 10, Line 44      Before "circuit" insert -- discharge --

Signed and Sealed this
Twenty-first Day of August, 2018

Andrei Iancu
*Director of the United States Patent and Trademark Office*